United States Patent [19]
Kawaguchi

[11] Patent Number: 6,052,171
[45] Date of Patent: Apr. 18, 2000

[54] LIQUID CRYSTAL DISPLAY WITH ELECTRICALLY CONNECTED INTEGRATED CIRCUITS AND OPPOSITE VOLTAGE LINE BETWEEN INPUT AND OUTPUT WIRINGS

[75] Inventor: Hisao Kawaguchi, Nara, Japan

[73] Assignee: Sharp Kabushiki Kaisha, Osaka, Japan

[21] Appl. No.: 09/261,167

[22] Filed: Mar. 3, 1999

[30] Foreign Application Priority Data

Mar. 5, 1998 [JP] Japan .................................. 10-053121

[51] Int. Cl.[7] .................................................. G02F 1/1345
[52] U.S. Cl. .......................... 349/149; 349/150; 349/152
[58] Field of Search ................................... 349/149, 151, 349/150, 152; 345/205, 204

[56] References Cited

U.S. PATENT DOCUMENTS

| | | | |
|---|---|---|---|
| 4,640,581 | 2/1987 | Nakanowatari et al. ................ | 349/149 |
| 5,130,833 | 7/1992 | Mase ........................................ | 349/149 |
| 5,193,022 | 3/1993 | Hirai ........................................ | 349/149 |
| 5,592,199 | 1/1997 | Kawaguchi et al. . | |
| 5,912,808 | 6/1999 | Ikemoto ................................... | 361/777 |

FOREIGN PATENT DOCUMENTS 6-231814  8/1994  Japan .

*Primary Examiner*—William L. Sikes
*Assistant Examiner*—Kari M. Horney
*Attorney, Agent, or Firm*—Nixon & Vanderhye, P.C.

[57] ABSTRACT

Source lines 11 of a liquid crystal panel 10 and output lines 21 for source lines of a TCP 24, an opposite-voltage use line 12 of the liquid crystal panel 10 and an opposite-voltage use line 22 of the TCP 24, connection lines 13 of the liquid crystal panel 10 and second input lines 25 of the TCP 24, and connection lines 13 adjacent to the foregoing connection lines 13 with the source lines 11 interposed therebetween and output lines 26 for liquid-crystal driver ICs of adjacent TCPs 24, are aligned with each other and electrically connected to each other by means of anisotropic conductive film or the like, respectively. Next, the opposite-voltage use line 22 of the TCP 24 and connection lines 34 of the circuit board 30, as well as a first input line 23 of the TCP 24 and connection lines 33 of the circuit board 30 are aligned with each other and electrically connected to each other by means of anisotropic conductive film or solder or the like. As a result, interconnection lines for electrically interconnecting the interconnection lines of adjacent TCPs 24 of the liquid crystal panel 10 and the opposite-voltage use line can be prevented from crossing each other, so that a low-price liquid crystal display without the use of multilayer interconnection can be obtained.

10 Claims, 4 Drawing Sheets

LIQUID CRYSTAL DISPLAY WITH ELECTRICALLY CONNECTED INTEGRATED CIRCUITS AND OPPOSITE VOLTAGE LINE BETWEEN INPUT AND OUTPUT WIRINGS

BACKGROUND OF THE INVENTION

The present invention relates to an assembly structure of a liquid crystal display comprising a liquid crystal display panel, TCPs and a circuit board.

Conventionally, the assembly structure of a liquid crystal panel and driver ICs in a liquid crystal display has been implemented mainly by TCP (Tape Carrier Package) and COG (Chip On Glass) systems.

In the case of the TCP system, as shown in FIG. 5, a flexible board 6 is equipped with a liquid-crystal driver IC 1, output signal lines 2 for delivering an output of the liquid-crystal driver IC 1 to a liquid crystal panel 7, and input signal lines 3 for inputting an outside signal to the liquid-crystal driver IC 1.

The input signal interconnections 3 of the flexible board 6 are electrically connected to a lead of the circuit board 5 located outside the liquid crystal panel 7, and function to transfer the outside signal to the liquid-crystal driver IC 1 through the lead of the circuit board 5.

Further, in order to obtain a high-reliability liquid crystal display having a high drop margin of opposite electrodes of the liquid crystal panel, a line 4 for opposite-voltage use is formed in the liquid crystal panel 7, the flexible board 6 and the circuit board 5.

Due to this arrangement, the circuit board 5 of the TCP system needs a very large number of input lines to supply signals to the input signal lines 3 of the flexible board 6, so that a multilayer laminate board comprising four to eight conductor layers is employed as the circuit board. The size of the multilayer laminate board needs to be 5 mm to 10 mm wide and 0.6 mm to 1 mm thick.

In the COG system, on the other hand, as shown in FIG. 6, a liquid-crystal driver IC 1, output signal lines 2 for delivering an output of the liquid-crystal driver IC 1 to a liquid crystal panel 7, and input signal lines 3 for inputting an outside signal to the liquid-crystal driver IC 1 are provided on a glass substrate in the periphery of the liquid crystal panel 7. Further, a circuit board 5 is provided outside the liquid crystal panel 7, and an input signal is fed from the circuit board 5 to the input signal lines 3 of each liquid-crystal driver IC 1.

Furthermore, in order to obtain a high-reliability liquid crystal display having a high drop margin of opposite electrodes of the liquid crystal panel, a line 4 for opposite-voltage use is formed in the liquid crystal panel 7 and the circuit board 5.

As another example of the COG system, there is also available a method in which lines for inputting a signal directed to the input signal lines 3 of the liquid-crystal driver IC 1 are formed on peripheral part of the liquid crystal panel 7. However, in this case, the lines in the peripheral part of the liquid crystal panel 7 would be increased in number, causing the size of the peripheral part of the liquid crystal panel 7 to be increased, or the lines in the peripheral part of the liquid crystal panel 7 would be implemented by multi-layer interconnection, causing the connection reliability to be degraded.

For the circuit board 5 of the liquid crystal display in the conventional TCP system, there is a need of forming a large number of interconnection lines to supply an input signal directed to the liquid-crystal driver IC 1 of the flexible board 6 as well as a signal to the opposite-voltage use line 4. This would cause the size of the circuit board 5 to be increased or involve the use of multilayer interconnection or other techniques, making it difficult to achieve cost reduction.

Therefore, as shown in FIG. 7, by forming a line 8 for electrically interconnecting the lines of the flexible board 6 adjacent to the peripheral part of the liquid crystal panel 7, and by connecting output lines derived from one liquid-crystal driver IC 1 and input lines of the other adjacent liquid-crystal driver IC 1 to each other, the number of interconnection lines of the circuit board can be reduced.

However, as shown in FIG. 7, since the line 8 for electrically interconnecting the lines of the neighboring flexible boards 6, 6 adjacent to the liquid crystal panel 7 and the opposite-voltage use line 4 cross each other (point A), multilayer interconnection needs to be provided, causing a degradation in connection reliability and an increase in manufacturing cost.

Therefore, an object of the present invention is to provide a liquid crystal display which eliminates the need of multi-layer interconnection or the like and which is high in connection reliability and low in price, with an arrangement that the lines for electrically interconnecting the lines of the neighboring flexible boards adjacent to peripheral part of the liquid crystal panel and the lines for opposite voltages do not cross each other.

In order to achieve the above object, there is provided a liquid crystal display including a liquid crystal panel in which liquid crystals are sandwiched between a pair of substrates, of which on one substrate are formed a plurality of thin film transistors corresponding to pixels and a plurality of interconnection lines for driving the thin film transistors while on the other substrate are formed opposite electrodes; a plurality of TCPs connected to the liquid crystal panel and each having a liquid-crystal driver IC provided therein; and a circuit board for feeding signals to the TCPs; wherein:

the circuit board comprises first wirings for feeding a signal which is not electrically connected to the liquid-crystal driver IC;

on one side of each of the TCPs are provided a second wiring connected to the liquid-crystal driver IC and connected to a wiring for driving the thin film transistors of the liquid crystal panel, third wirings which are arranged at both sides of the second wiring and connected to the liquid-crystal drive IC and which serve to electrically connect said TCP to its adjacent TCPs in both sides, and a fourth wiring which is formed between the second wiring and the third wirings and which is not electrically connected to the liquid-crystal driver IC;

on one side of the liquid crystal panel are provided a group of the wirings for driving the thin film transistors collectively led out in units of corresponding one TCP, and a fifth wiring for electrically connecting TCPs adjacent to both sides of the group of the wirings; and wherein the first wiring of the circuit board and the fourth wiring of the TCP, the second wiring of the TCP and the group of wirings of the liquid crystal panel, and the third wirings of the TCP and the fifth wiring of the liquid crystal panel are connected to each other, respectively.

According to the liquid crystal display of the above construction, the TCP is provided with wirings that are not electrically connected to the liquid-crystal driver IC and that are to be connected to the liquid crystal panel, when electrical connection between a TCP and its adjacent TCPs is implemented by using wirings of the liquid crystal panel, routing can be accomplished without involving the crossing between the wirings that are not electrically connected to the liquid-crystal driver IC and the wirings that serve for the electrical connection between a TCP and its adjacent TCPs.

According to the liquid crystal display in one embodiment of the present invention, since input signals for the liquid-crystal driver ICs are obtained from both the liquid crystal panel side and the circuit board side, input signal lines from the circuit board side to the liquid-crystal driver IC side can be reduced to several power supply lines that should be prevented from voltage drops as much as possible, and ten odd to twenty odd other input signal lines can be wired on the liquid crystal panel side. As a result, the area, number of interconnection layers, thickness and cost of the circuit board can be reduced to a substantial extent as much as 50% or more each.

According to the liquid crystal display in one embodiment of the present invention, since peripheral part of the liquid crystal panel except the connecting portions with the wirings of the TCPS is all covered with an insulating film, the routing of wirings for driving the thin film transistors that could conventionally be routed only inside the seal portion of the facing-side glass of the liquid crystal panel becomes possible to route up to regions outside the seal portion. Thus, line angle and line width of the wirings can be broadened so that the non-difective rate of the wiring formation on the panel can be improved.

According to the liquid crystal display in one embodiment of the present invention, since the circuit board can be set on the rear side of one of substrates of the liquid crystal panel by folding the slit portions of the TCPs, a liquid crystal display having a small picture frame can be fabricated.

According to the liquid crystal display in one embodiment of the present invention, since the insulating film is formed at the slit portions of the TCPs, a liquid crystal display which is improved in strength at the folding portions and which is highly vibration-resistant and highly shock-resistant and free from any electrical defects due to adhesion of electrically conductive foreign matters from outside to the wirings can be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
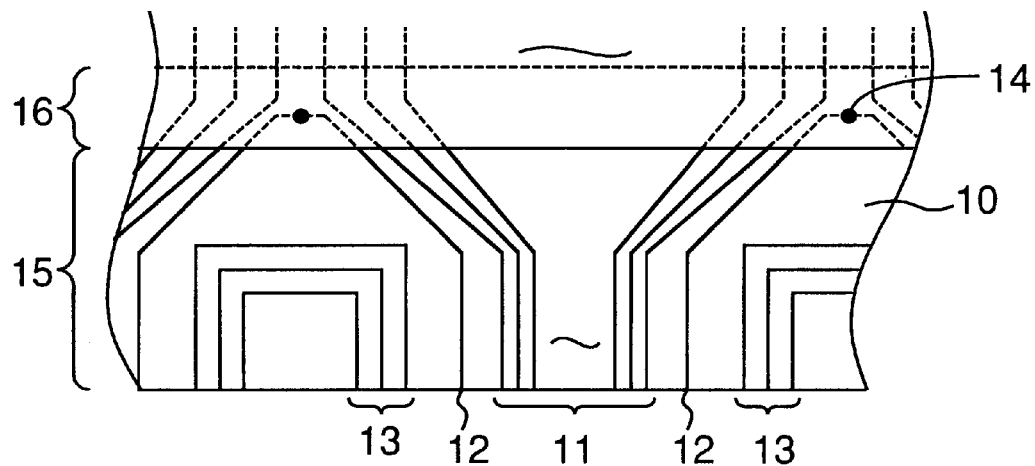
FIG. 1A is a view showing a peripheral part of a liquid crystal panel 10.
Figure 1B:
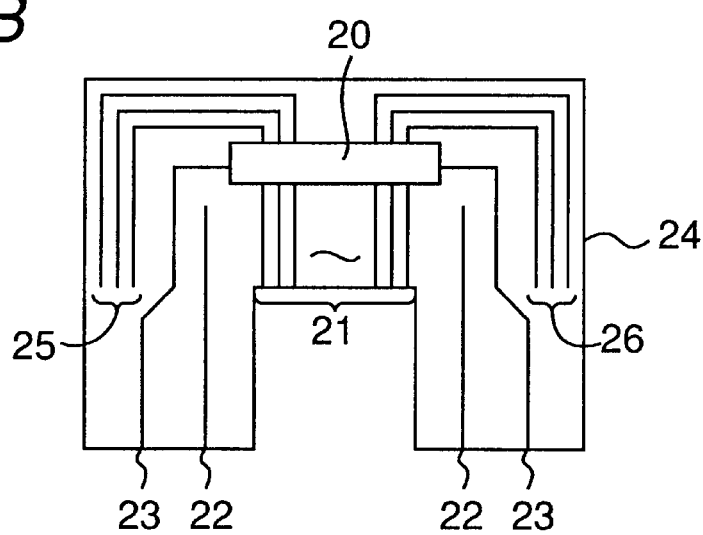
FIG. 1B is a view showing a TCP 24 and FIG. 1C is a view showing a circuit board 30.
Figure 1C:
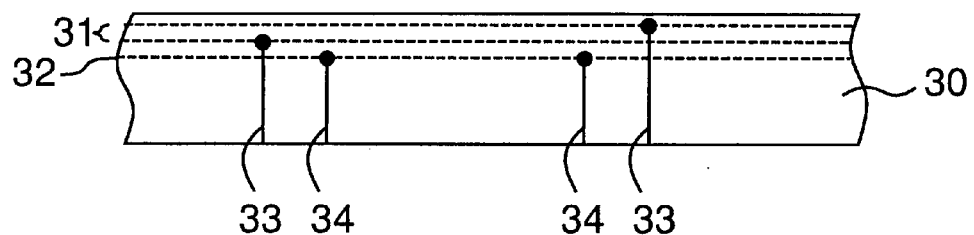
Figure 2:
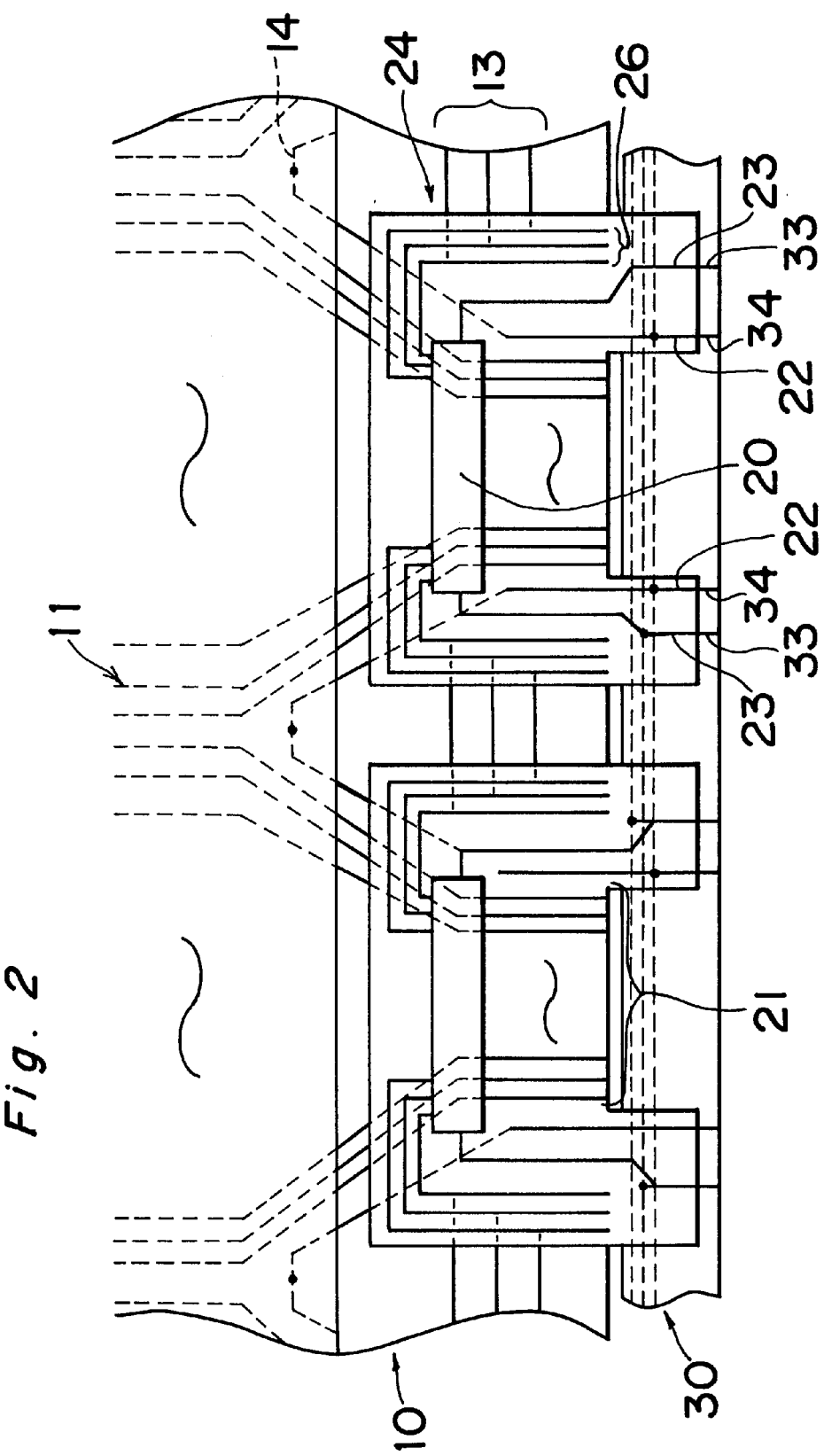
FIG. 2 is a view showing an arrangement in which the TCP 24 and the circuit board 30 are connected to the liquid crystal panel 10.

A liquid crystal display according to an embodiment of the present invention is explained with reference to FIGS. 1A, 1B, 1C and FIG. 2. FIG. 1A is a view showing a peripheral part of a liquid crystal panel 10, FIG. 1B is a view showing a TCP 24 and FIG. 1C is a view showing a circuit board 30. Also, FIG. 2 is a view showing an arrangement in which the TCP 24 and the circuit board 30 are connected to the liquid crystal panel 10.

The liquid crystal panel 10 shown in FIG. 1A is explained.

In the liquid crystal panel 10, liquid crystals are sandwiched between a pair of glass substrates, one glass substrate being an active matrix substrate on which are formed thin film transistors connected to a pixel electrode as well as gate lines and source lines for controlling the thin film transistors, and the other glass substrate being an opposite substrate on which an opposite electrode is formed.

As shown in FIG. 1A, the active matrix substrate has a peripheral part 15 larger than that of the opposite substrate, where is formed a region for interconnecting the interconnection lines of the active matrix substrate and external interconnection lines to each other.

A plurality of source lines 11 as a wiring for driving the thin film transistors are formed in the peripheral part of the liquid crystal panel 10, an opposite-voltage use line 12 of the liquid crystal panel 10 for supplying an opposite voltage to an opposite electrode is formed on both sides of the source lines 11, and connection lines 13 as a fifth wiring for interconnecting the lines of a liquid-crystal driver ICs 20, 20 provided to adjacent two TCPs 24 are formed further outside the opposite-voltage use lines 12.

The opposite-voltage use line 12 of the liquid crystal panel 10 is electrically connected to an opposite electrode formed in the opposite substrate by an opposite-electrode transition portion 14 made of an electrically conductive material provided in a seal portion 16 of the liquid crystal panel 10.

Also, all the region except the interconnection lines of the liquid crystal panel 10 and the interconnection lines of the TCPs 24 is covered with an insulating film.

Next, the TCP 24 shown in FIG. 1B is explained.

Output lines 21 as a second wiring for source lines are interconnection lines which are formed near the center of one side of the TCP 24 and which serve for outputting a signal voltage from the liquid-crystal driver IC 20 to the source lines 11 of the liquid crystal panel 10.

An opposite-voltage use line 22 as a fourth wiring of the TCP 24 is an interconnection line which is formed on both sides of the output lines 21 as the second wiring for source lines, and which serves to electrically interconnect an opposite-voltage use line 32 as a first wiring of the circuit board 30 and the opposite-voltage use line 12 of the liquid crystal panel 10. The opposite-voltage use line 22 is not electrically connected to the liquid-crystal driver IC 20.

A first input line 23 is an interconnection line which is formed outside the opposite-voltage use line 22 as the fourth wiring of the TCP 24, and which serves to input a signal necessary for the drive of the liquid-crystal driver IC 20, one end of the first input line 23 being connected to the liquid-crystal drive IC 20, and the other end being connected a connection lead 33 of a signal input line 31 of the circuit board 30. The first input line 23 is formed two for one TCP in this embodiment, but may be one or some plurality.

Second input lines 25 as a third wiring are interconnection lines for inputting a signal necessary for the drive of the liquid-crystal driver IC 20, one end of the second input lines 25 as the third wiring being connected to the liquid-crystal driver IC 20 and the other end being connected to the connection lines 13 of the liquid crystal panel 10.

Output lines 26 as a third wiring for adjacent liquid-crystal driver ICs are interconnection lines for outputting a signal necessary for the liquid-crystal driver IC provided to adjacent TCPs, one end of the output lines 26 being connected to the liquid-crystal driver IC 20 and the other end being connected to the connection lines 13 as the fifth wiring of the liquid crystal panel 10.

Next, the circuit board 30 shown in FIG. 1C is explained.

Signal input lines 31 are interconnection lines for feeding a voltage to the first input line 23 as a seventh wiring of the TCP 24, and an opposite-voltage use line 32 of the circuit board 30 is a interconnection line for feeding a voltage to the opposite-voltage use line 12 of the liquid crystal panel 10 via the TCP 24. Since an insulating film is formed above the signal input lines 31 and the opposite-voltage use line 32 as the first wiring of the circuit board 30, contact holes are formed in the insulating film above the signal input lines 31 and the opposite-voltage use connection line 32 in order to electrically interconnect the lines of the circuit board and the lines of the TCP, where the lines of the TCP and the lines of the circuit board are electrically interconnected by connection lines 33 as a sixth wiring, 34 as a first wiring formed at the contact holes.

The method for connecting the liquid crystal panel 10, the TCPs 24 and the circuit board 30 to one another is shown below. The source lines 11 of the liquid crystal panel 10 and the output lines 21 for source lines of the TCP 24, the opposite-voltage use line 12 of the liquid crystal panel 10 and the opposite-voltage use connection line 22 of the TCP 24, the left-side connection lines 13 of the liquid crystal panel 10 and the second input lines 25 of the TCP 24, and the right-side connection lines 13 of the liquid crystal panel 10 adjacent to the left-side connection lines 13 with the source lines 11 interposed therebetween and output lines 26 for the liquid-crystal driver IC of the TCPs 24, are aligned with each other and electrically connected to each other by means of anisotropic conductive film or the like, respectively.

Next, the opposite-voltage use lines 22 of the TCP 24 and the connection lines 34 of the circuit board 30, as well as the first input lines 23 as the seventh wiring of the TCP 24 and the connection lines 33 as the sixth wiring are aligned with each other and electrically connected by means of anisotropic conductive film or solder or the like.

In this way, to the liquid-crystal driver IC 20, an input signal from the signal input lines 31 of the circuit board 30 is inputted while an input signal from the adjacent TCPs is inputted via the connection lines 13 of the liquid crystal panel 10, respectively.

Also, the opposite voltage for the opposite electrode of the liquid crystal panel 10 is inputted from the opposite-voltage use line 32 of the circuit board 30 via the TCPs 24 and the opposite-voltage use line 12 of the liquid crystal panel 10.

In this embodiment, since the opposite-electrode transition portion 14 for applying the opposite voltage to the opposite electrode of the liquid crystal panel 10 is formed at least one for every TCP 24 in the peripheral part of the liquid crystal panel, a high-reliability liquid crystal display having a high voltage drop margin can be obtained.

Also, since the opposite-voltage use line 12 of the liquid crystal panel 10 connected to one opposite-electrode transition portion 14 is connected to its corresponding opposite-voltage use line 22 of adjacent TCPs 24, a sufficient opposite voltage can be applied to the opposite electrode. Further, even if the voltage from the opposite-voltage use line of one TCP 24 is not inputted because of disconnection or connection failure, the opposite voltage is applied to the opposite electrode by the opposite-voltage use line of the other TCP 24.

Also, since the connection lines 13 and the like formed in the liquid crystal panel 10 are made of the same material as the internal interconnection lines and the like of the liquid crystal panel 10 for space-saving of the peripheral part of the liquid crystal panel and simplification of processes, it is difficult to reduce their resistance values to sufficiently small ones. Therefore, input power supply or the like, which is a disadvantageous signal to high resistance even among the signals necessary for the drive of the liquid-crystal driver ICs 20, is inputted to the liquid-crystal driver ICs by using the interconnection lines of the circuit board 30 and the first input line of the TCP 24.

The interconnection lines of the circuit board 30, which is a board provided separately from the liquid crystal panel 10, is free from restrictions that would cause the interconnection lines to have particularly high resistance, and so can be formed into low-resistance interconnection lines.

Accordingly, with respect to the opposite voltage to be applied to the opposite electrode, if high-resistance interconnection lines to be formed on the liquid crystal panel 10 are routed and connected to the opposite electrode, there would arise voltage drops or waveform distortions so that a desired opposite voltage could not be applied to the opposite electrode.

In this embodiment, by inputting part of the input signal to the liquid-crystal driver IC 20 via the connection lines 13 of the liquid crystal panel 10, the number of interconnection lines of the circuit board 30 can be reduced so that a cost reduction and a reduction of mounting area of the circuit board 30 can be achieved. Actually, around 23 to 25 input signal lines as well as 8 to 10 input power supply lines would be required in the case of the thin-film-transistor type liquid crystal display. However, by reducing the number of interconnection lines of the circuit board 30 to eight to ten lines, equivalent to the number of input power supply lines or the like, the circuit board 30 can be provided as a double-sided board, while the width of the circuit board 30 can be reduced to one half. Thus, the cost reduction and the mounting-area reduction become feasible.

Figure 3:
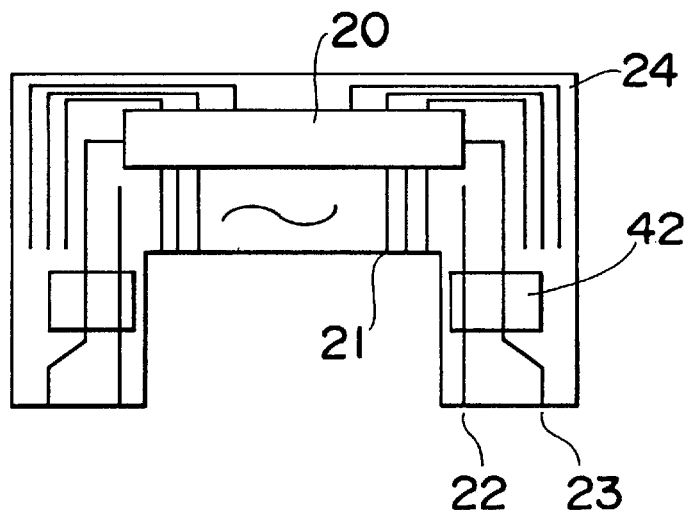
FIG. 3 is a view showing another example of the TCP 24 in the embodiment.

Next, another example of the TCP 24 is shown in FIG. 3. In this example, a slit 42 for folding use is provided in the TCP 24.

Figure 4:
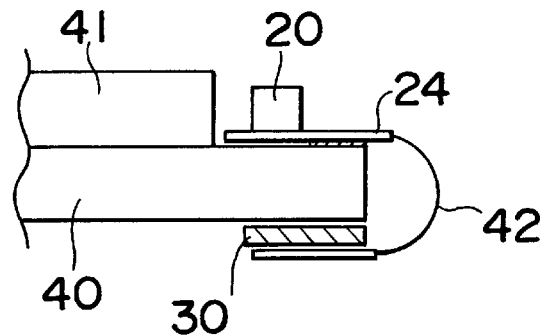
FIG. 4 shows a side view of a liquid crystal display using the TCP 24 of FIG. 3.
Figure 5:
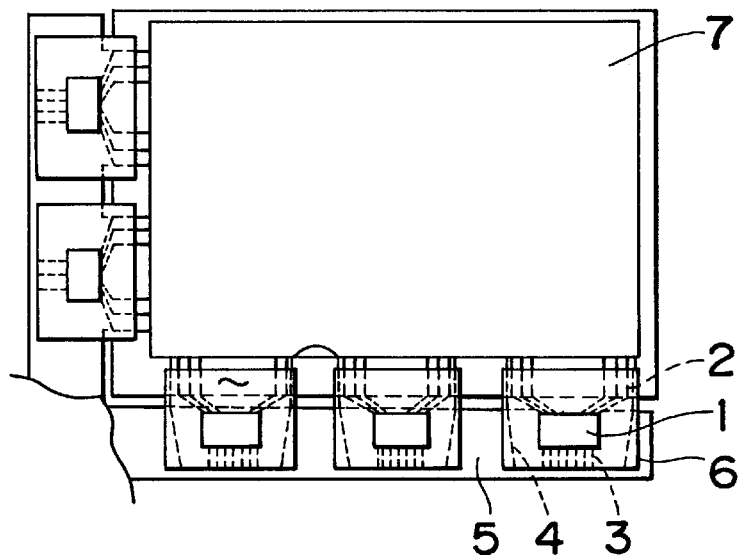
FIG. 5 is a view showing a liquid crystal display of the conventional TCP system.
Figure 6:
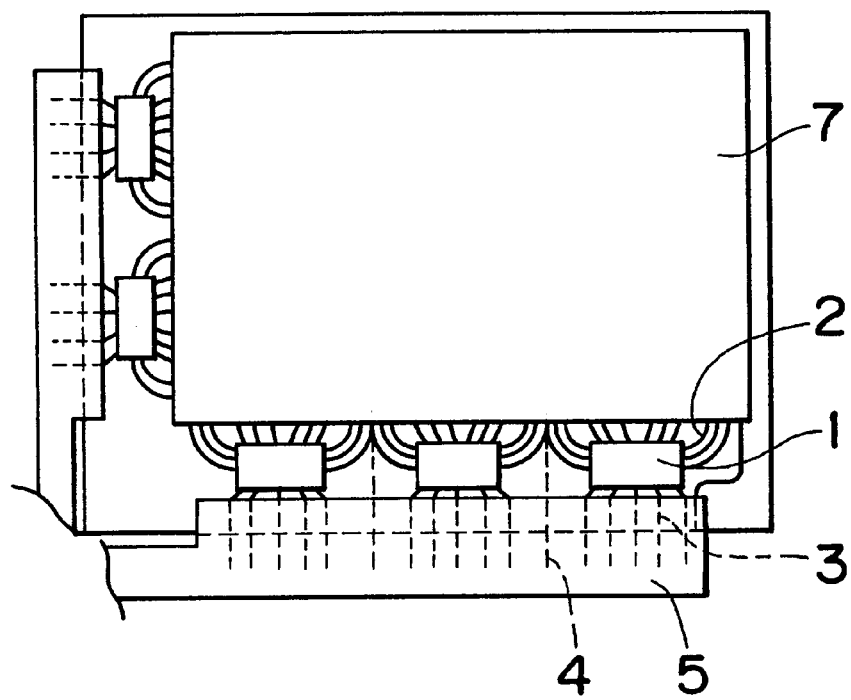
FIG. 6 is a view showing a liquid crystal display of the conventional COG system.
Figure 7:
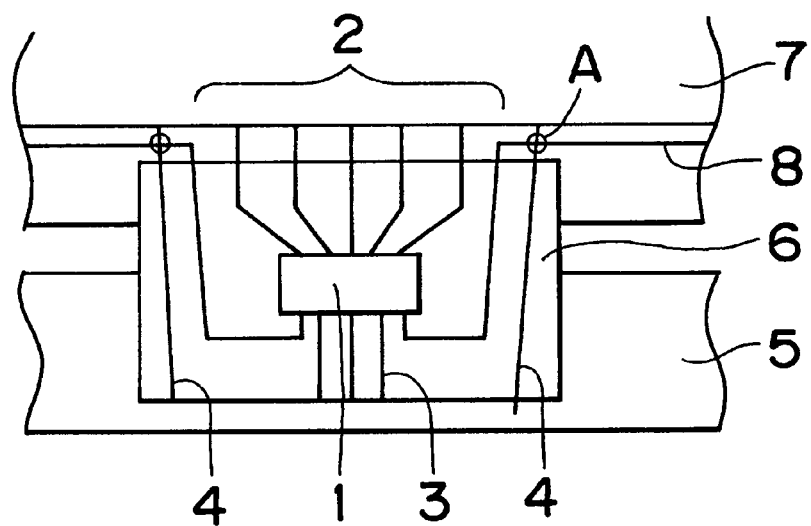
FIG. 7 is a view showing a liquid crystal display which is a modification example of the conventional TCP system.

FIG. 4 shows a side view of a liquid crystal display using the TCP 24 shown in FIG. 3.

A liquid crystal panel 10 comprises an active matrix substrate 40 and an opposite substrate 41.

The TCP 24, after connected to the active matrix substrate 40 of the liquid crystal panel 10 and the circuit board 30, is folded at the slit portion 42, and the circuit board 30 is placed on the rear side of the active matrix substrate 40.

Also, an insulating film may be provided at the slit portion of the TCP 24.

The above embodiment has been described with respect to the source line side of the active-matrix liquid crystal panel. However, the embodiment is applicable also to the gate line side, and similar effects can be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A liquid crystal display including a liquid crystal panel in which liquid crystals are sandwiched between a pair of substrates, of which on one substrate are formed a plurality of thin film transistors corresponding to pixels and a plurality of interconnection lines for driving the thin film transistors while on the other substrate are formed opposite electrodes; a plurality of TCPs connected to the liquid crystal panel and each having a liquid-crystal driver IC provided therein; and a circuit board for feeding signals to the TCPs; wherein the circuit board comprises first wirings for feeding a signal which is not electrically connected to the liquid-crystal driver IC;

on one side of each of the TCPs are provided a second wiring connected to the liquid-crystal driver IC and connected to a wiring for driving the thin film transistors of the liquid crystal panel, third wirings which are arranged at both sides of the second wiring and connected to the liquid-crystal driver IC and which serve to electrically connect said TCP to its adjacent TCPs on both sides, and a fourth wiring which is formed between the second wiring and the third wirings and which is not electrically connected to the liquid-crystal driver IC;

on one side of the liquid crystal panel are provided a group of the wirings for driving the thin film transistors collectively led out in units of corresponding one TCP, and a fifth wiring for electrically connecting TCPs adjacent to both sides of the group of the wirings; and wherein the first wiring of the circuit board and the fourth wiring of the TCP, the second wiring of the TCP and the group of wirings of the liquid crystal panel, and the third wirings of the TCP and the fifth wiring of the liquid crystal panel are connected to each other, respectively.

2. The liquid crystal display according to claim 1, wherein in the circuit board is formed a sixth wiring for feeding necessary signals to the liquid-crystal driver IC of the TCP; on the one side of the TCP, a seventh wiring is formed between the third wirings and the second wiring of the TCP; and the sixth wiring of the circuit board and the seventh wiring of the TCP are connected to each other.

3. The liquid crystal display according to claim 2, wherein one of the substrates of the liquid crystal panel is coated with an insulating film entirely except connecting portions between the wirings of the liquid crystal panel and the wirings of the TCP.

4. The liquid crystal display according to claim 2, wherein the TCP has a slit formed between a connecting portion with the liquid crystal panel and a connecting portion with the circuit board, and the circuit board is set on a rear side of one substrate of the liquid crystal panel by folding the TCP at the slit portion.

5. The liquid crystal display according to claim 4, wherein an insulating film is formed at the slit portion of the TCP.

6. The liquid crystal display according to claim 1, wherein one of the substrates of the liquid crystal panel is coated with an insulating film entirely except connecting portions between the wirings of the liquid crystal panel and the wirings of the TCP.

7. The liquid crystal display according to claim 6, wherein the TCP has a slit formed between a connecting portion with the liquid crystal panel and a connecting portion with the circuit board, and the circuit board is set on a rear side of one substrate of the liquid crystal panel by folding the TCP at the slit portion.

8. The liquid crystal display according to claim 7, wherein an insulating film is formed at the slit portion of the TCP.

9. The liquid crystal display according to claim 1, wherein the TCP has a slit formed between a connecting portion with the liquid crystal panel and a connecting portion with the circuit board, and the circuit board is set on a rear side of one substrate of the liquid crystal panel by folding the TCP at the slit portion.

10. The liquid crystal display according to claim 9, wherein an insulating film is formed at the slit portion of the TCP.

* * * * *